United States Patent
Scott

(10) Patent No.: US 10,069,498 B2
(45) Date of Patent: Sep. 4, 2018

(54) SIMULTANEOUS MULTI-EFFECT OSCILLATOR COMPENSATION USING PIECEWISE INTERDEPENDENT POLYNOMIALS

(71) Applicant: Greenray Industries, Inc., Mechanicsburg, PA (US)

(72) Inventor: Jonathan George Scott, Mechanicsburg, PA (US)

(73) Assignee: Greenray Industries, Inc., Machanicsburg, PA (US)

( * ) Notice: Subject to any disclaimer, the term of this patent is extended or adjusted under 35 U.S.C. 154(b) by 0 days.

(21) Appl. No.: 15/608,438

(22) Filed: May 30, 2017

(65) Prior Publication Data

US 2018/0006654 A1    Jan. 4, 2018

Related U.S. Application Data

(60) Provisional application No. 62/357,637, filed on Jul. 1, 2016, provisional application No. 62/440,997, filed on Dec. 30, 2016.

(51) Int. Cl.
*H04B 1/40* (2015.01)
*H03L 1/02* (2006.01)
*H03B 5/04* (2006.01)

(52) U.S. Cl.
CPC .............. *H03L 1/025* (2013.01); *H03B 5/04* (2013.01)

(58) Field of Classification Search
CPC .. H03L 1/025; H03B 5/04; H03B 1/04; H03B 2200/0002; H03B 2200/003
See application file for complete search history.

(56) References Cited

U.S. PATENT DOCUMENTS

| | | | |
|---|---|---|---|
| 4,079,280 A | 3/1978 | Kusters et al. | |
| 4,560,959 A | 12/1985 | Rokos et al. | |
| 4,891,611 A | 1/1990 | Frerking | |
| 5,892,408 A | 4/1999 | Binder | |
| 6,362,699 B1 | 3/2002 | Fry | |
| 6,362,700 B1 | 3/2002 | Fry | |

(Continued)

OTHER PUBLICATIONS

Esterline et al., Temperature and Trim Effect Compensation of a VCXO Using a Multi-Dimensional Segmented Polynomial Array Feb. 15, 2018.

(Continued)

*Primary Examiner* — Tuan Pham
(74) *Attorney, Agent, or Firm* — Knobbe, Martens, Olson & Bear, LLP

(57) ABSTRACT

A packaged VCTCXO may include a crystal oscillator configured to output a signal of a particular frequency and a temperature sensor configured to measure an internal temperature of the crystal oscillator. In addition, the packaged VCTCXO may include a microcontroller configured to generate an internal control voltage signal based at least in part on the temperature and an external control voltage received by the packaged VCTCXO. Moreover, the packaged VCTCXO may include a combiner configured to combine an internal control voltage and the external control voltage to generate a control voltage. Further, the control voltage may be supplied to the crystal oscillator to cause the crystal oscillator to generate the signal of the particular frequency.

22 Claims, 10 Drawing Sheets

(56) References Cited

U.S. PATENT DOCUMENTS

| | | | |
|---|---|---|---|
| 6,501,340 | B1 | 12/2002 | Flood |
| 6,549,055 | B2 | 4/2003 | Rokos |
| 6,661,302 | B1 | 12/2003 | Rathore et al. |
| 7,148,761 | B1 | 12/2006 | Shieh |
| 7,253,694 | B2 | 8/2007 | Hardy et al. |
| 7,573,345 | B2 | 8/2009 | Hardy et al. |
| 9,225,340 | B2 | 12/2015 | Rae et al. |
| 2002/0060597 | A1 | 5/2002 | Storm Rokos |
| 2003/0184399 | A1 | 10/2003 | Lanoue et al. |
| 2006/0267703 | A1 | 11/2006 | Wang et al. |
| 2008/0164952 | A1 | 7/2008 | Babitch |
| 2010/0060365 | A1* | 3/2010 | Kimura .................... H03L 7/14 331/17 |
| 2013/0038400 | A1* | 2/2013 | Asamura ................ H03L 1/025 331/158 |
| 2014/0218119 | A1 | 8/2014 | He |
| 2015/0123743 | A1* | 5/2015 | Kiyohara ................. H03L 7/00 331/36 C |
| 2017/0324376 | A1 | 11/2017 | Esterline et al. |

OTHER PUBLICATIONS

Esterline et al., Temperature and Trim Effect Compensation of a Vcxo Using a Multidimensional Segmented Polynomial Array, Accessed Feb. 15, 2018.

Esterline Research & Design, https://esterlinereseaich.com/, Accessed Feb. 15, 2018.

Esterline Research & Design, What is M-SAC? Temperature and Trim Effect Compensation of a VCXO Using a Multidimensional Segmented Polynomial Array, Jun. 13, 2016.

* cited by examiner

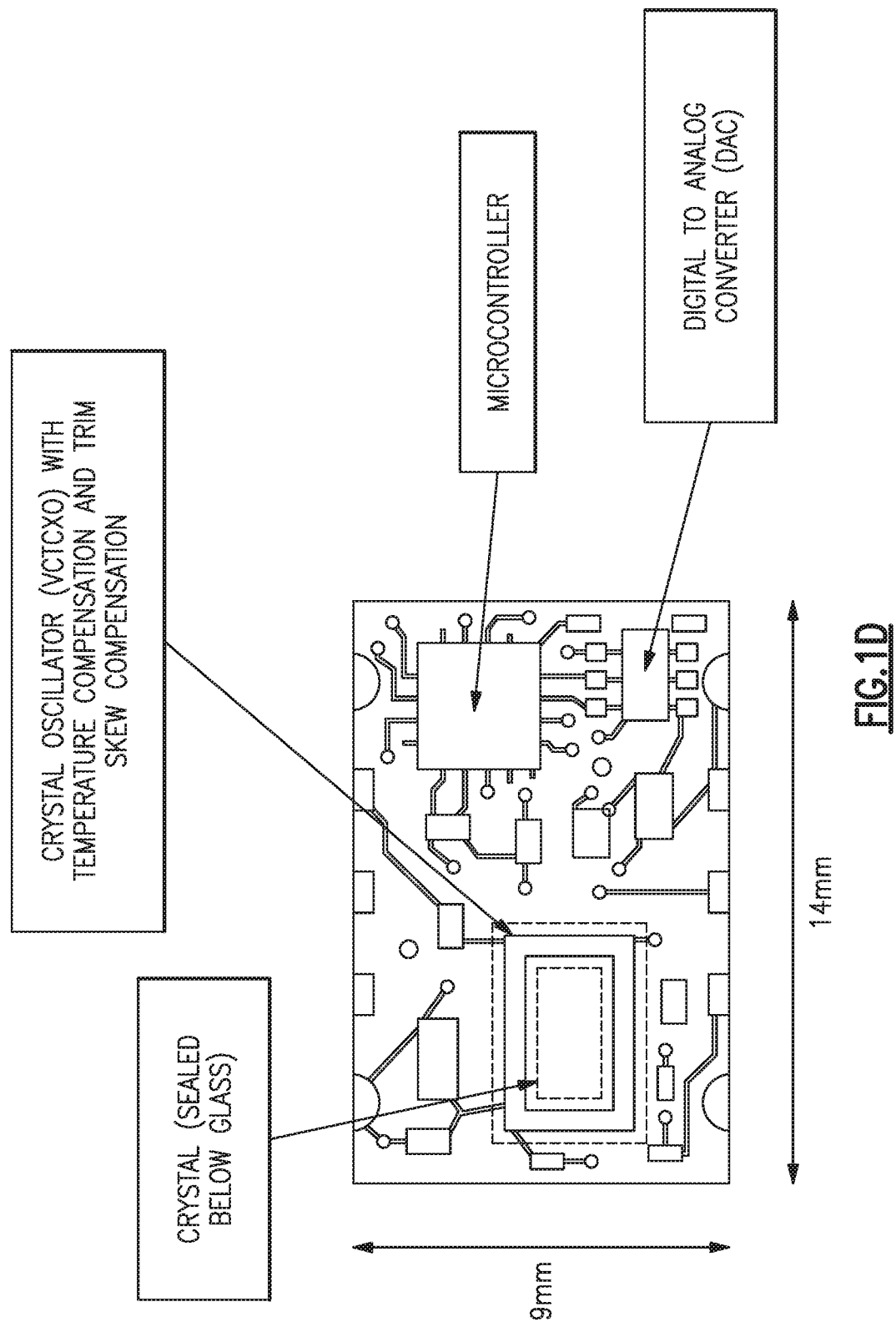

Compensated and linearized trim skew

SIMULTANEOUS MULTI-EFFECT OSCILLATOR COMPENSATION USING PIECEWISE INTERDEPENDENT POLYNOMIALS

INCORPORATION BY REFERENCE TO ANY PRIORITY APPLICATIONS

This application claims the benefit of U.S. Provisional Patent Application No. 62/357,637, filed Jul. 1, 2016, and titled "OSCILLATOR COMPENSATION METHOD USING AN ARRAY OF MULTIDIMENSIONAL PIECEWISE POLYNOMIALS," and U.S. Provisional Patent Application No. 62/440,997, filed Dec. 30, 2016, and titled "SIMULTANEOUS MULTI-EFFECT OSCILLATOR COMPENSATION USING PIECEWISE INTERDEPENDENT POLYNOMIALS," the disclosures of which are hereby incorporated by reference in their entirety for all purposes herein. Any and all applications, if any, for which a foreign or domestic priority claim is identified in the Application Data Sheet of the present application are hereby incorporated by reference in their entireties under 37 CFR 1.57.

BACKGROUND

It is desirable to compensate a quartz crystal oscillator for the unwanted frequency effects of temperature and trim skew. Some methods of compensating an oscillator for the unwanted effects of environmental stimuli have previously been developed. Often multiple compensation methods are used to compensate for different unwanted effects caused by environmental stimuli resulting in complex and larger than desired oscillator packages.

BRIEF DESCRIPTION OF THE DRAWINGS

Throughout the drawings, reference numbers are re-used to indicate correspondence between referenced elements. The drawings are provided to illustrate embodiments of the inventive subject matter described herein and not to limit the scope thereof.

FIG. 1D illustrates an example implementation of an integrated voltage-controlled temperature-compensated crystal oscillator package implemented on a printed circuit board.

SUMMARY

Figure 1A:
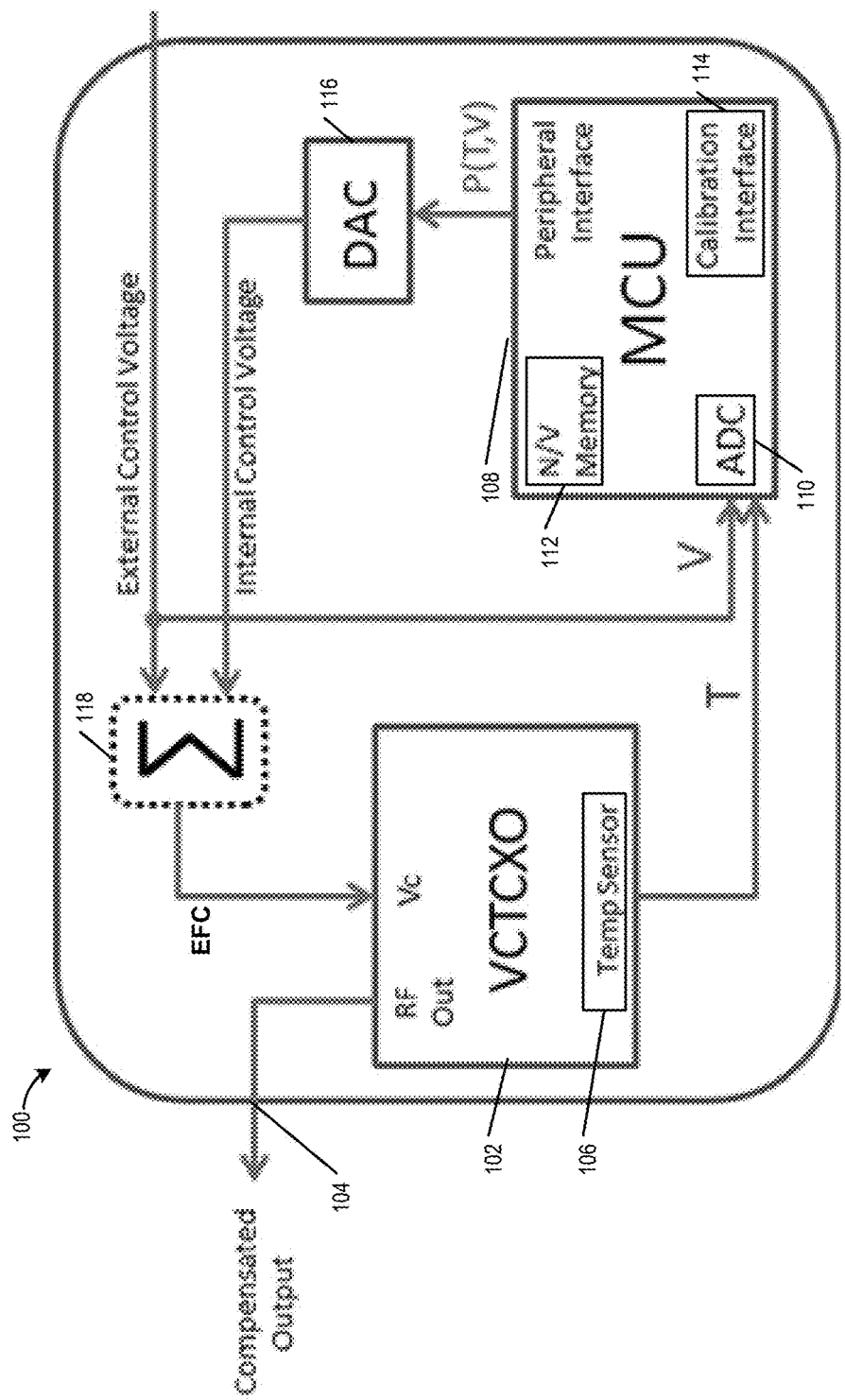
FIG. 1A illustrates an embodiment of an integrated voltage-controlled temperature-compensated crystal oscillator package.

The systems, methods and devices of this disclosure each have several innovative aspects, no single one of which is solely responsible for all of the desirable attributes disclosed herein. Details of one or more implementations of the subject matter described in this specification are set forth in the accompanying drawings and the description below.

Certain embodiments of the present disclosure relate to a packaged voltage-controlled temperature-compensated crystal oscillator (VCTCXO). The packaged VCTCXO may include a crystal oscillator configured to output a signal of a particular frequency. Further, the packaged VCTCXO may include a temperature sensor configured to measure a temperature of the crystal oscillator. In addition, the packaged VCTCXO may include a microcontroller configured to generate an internal control voltage signal based at least in part on the temperature and an external control voltage received by the packaged VCTCXO. Moreover, the packaged VCTCXO may include a combiner configured to combine an internal control voltage and the external control voltage to generate a control voltage. The internal control voltage may be generated based at least in part on the internal control voltage signal. Further, the control voltage may be supplied to the crystal oscillator to cause the crystal oscillator to generate the signal of the particular frequency.

In certain embodiments, the packaged VCTCXO may include a digital to analog converter configured to generate the internal control voltage based at least in part on the internal control voltage signal. The combiner may be further configured to weight the external control voltage and the internal control voltage differently. In some cases, the combiner is further configured to weight the external control voltage more than the internal control voltage.

With some implementations, the packaged VCTCXO may further include a non-volatile memory configured to store one or more coefficients based on a measured frequency error of the crystal oscillator for a set of test temperature and/or a set of test voltage values. The microcontroller may be further configured to generate the internal control voltage signal based at least in part on the one or more coefficients. Further, the measured frequency error may be based on a deviation from a nominal frequency of the crystal oscillator. In some cases, the microcontroller is further configured to generate piecewise polynomial curves based at least in part on the one or more coefficients. The piecewise polynomial curves may be used to generate the internal control voltage signal based at least in part on the external control voltage and the temperature measured by the temperature sensor.

In some embodiments, the packaged VCTCXO further includes a voltage controlled temperature compensated crystal oscillator (VCTCXO) comprising the crystal oscillator and the temperature sensor. In some cases, the microcontroller is configured to automatically generate the internal control voltage signal based at least in part on the temperature measured by the temperature sensor without input from a user.

Certain embodiments of the present disclosure relate to a method for controlling a crystal oscillator. The method may be implemented, at least in part, by a processor or a microcontroller that may be included in a package with the crystal oscillator or that may be external to a packaged crystal oscillator. The method may include determining a characteristic of a crystal oscillator. The characteristic of the crystal oscillator may differ from a corresponding characteristic of another crystal oscillator. Further, the method may include receiving a temperature signal corresponding to a temperature of the crystal oscillator and generating an internal voltage control signal based at least in part on the temperature signal and the characteristic of the crystal oscillator. In addition, the method may include receiving an external voltage control signal and determining a frequency adjustment signal based at least in part on a combination of the voltage control signal and the external voltage control signal. Moreover, the method may include providing the frequency adjustment signal to the crystal oscillator.

In some embodiments, the temperature signal comprises an analog voltage signal. Further, the characteristic of the crystal oscillator may be unique to the crystal oscillator and is not shared by other crystal oscillators. In some cases, the external control voltage is received as an electronic frequency control signal from one of a feedback system or a phase-locked loop.

Figure 2:
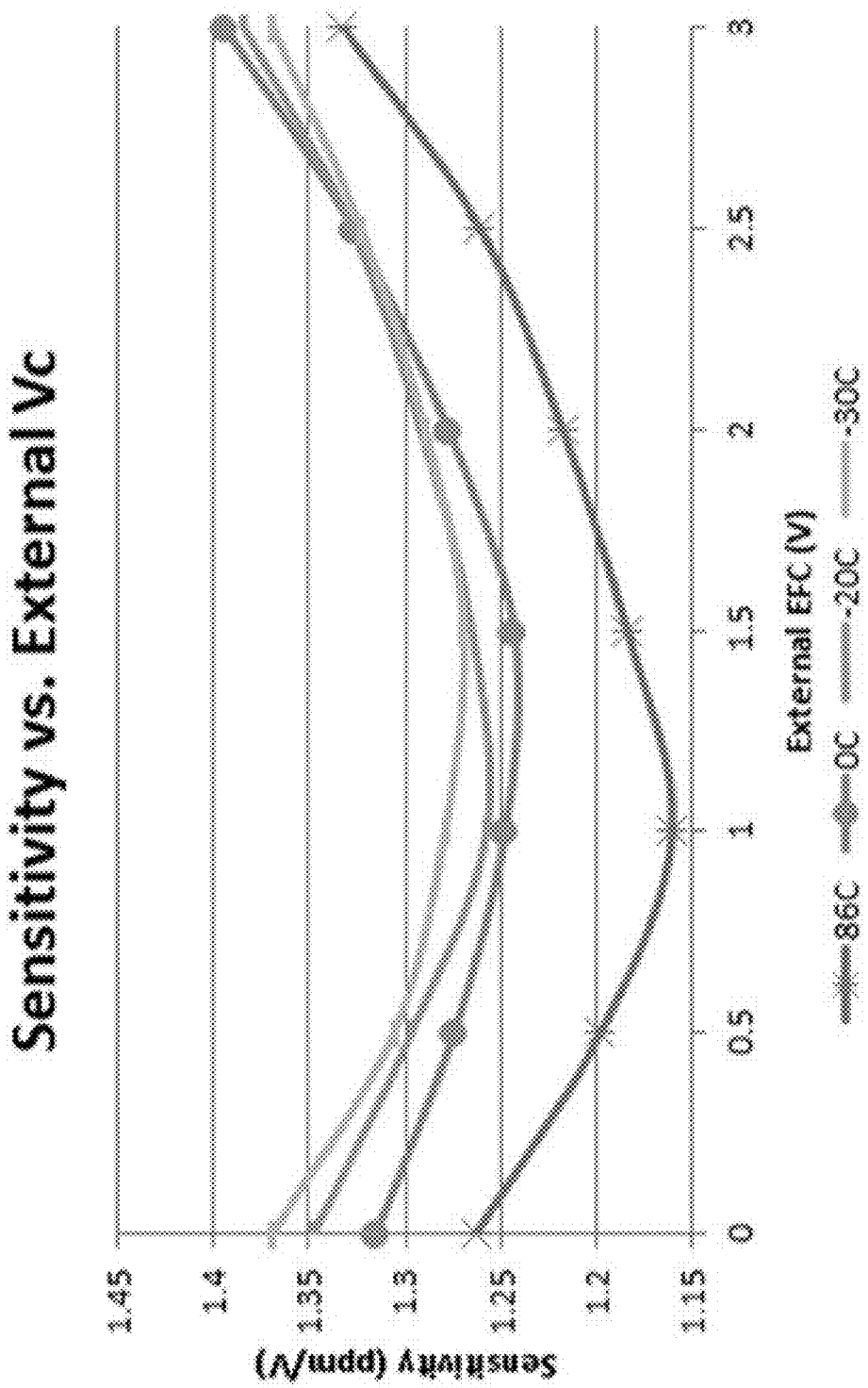
FIG. 2 illustrates the sensitivity of an oscillator to different external control voltages applied at select temperatures that correspond to a desired temperature operational range.
Figure 3:
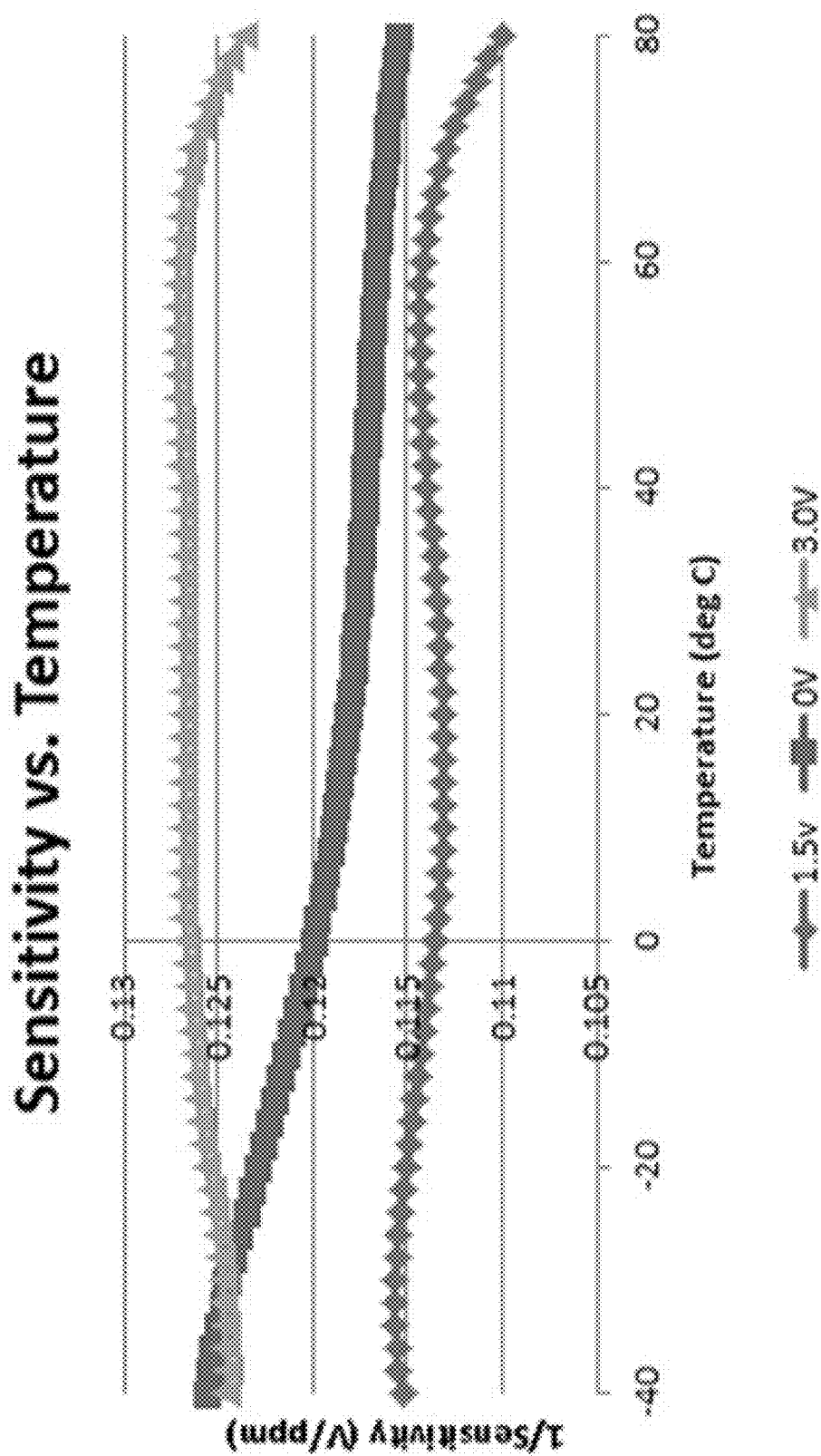
FIG. 3 illustrates the sensitivity of an oscillator to different temperatures at select external control voltages that correspond to a desired voltage operational range.
Figure 4:
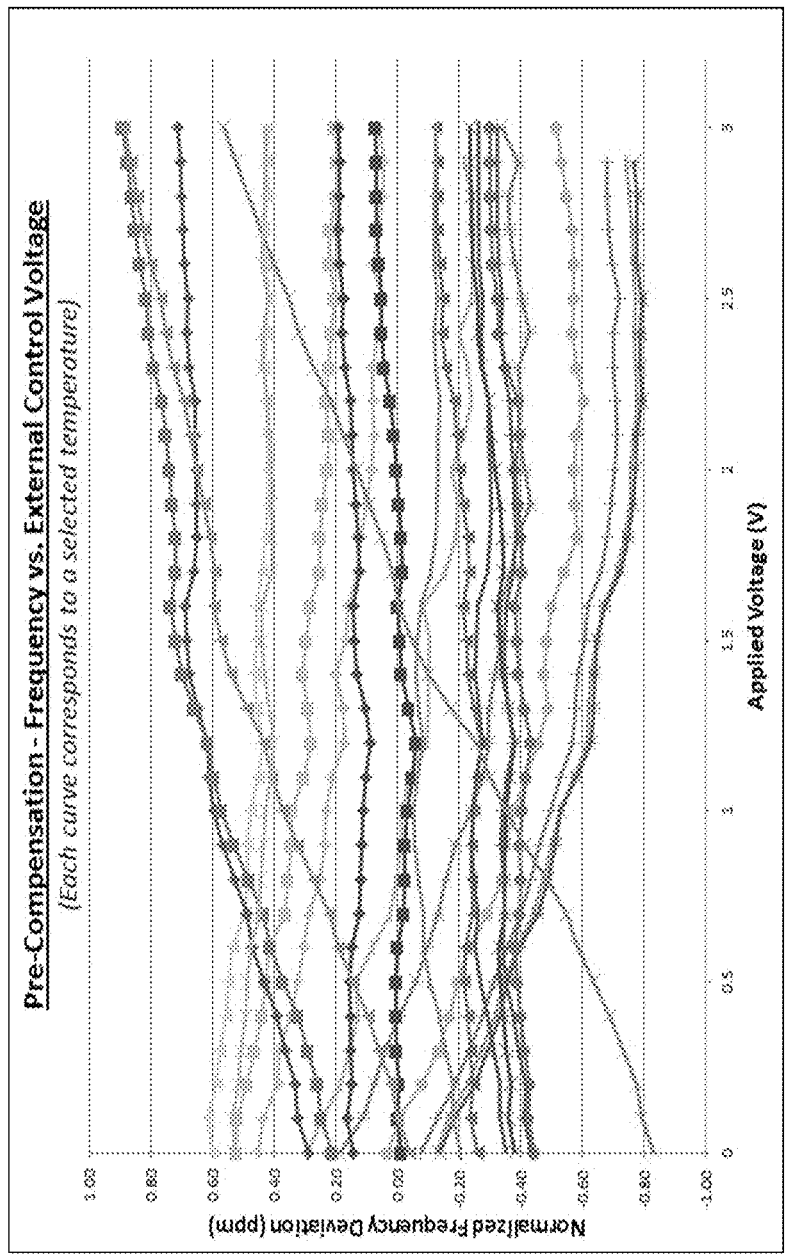
FIG. 4 illustrates the trim skew effects and non-linearity of an oscillator's output frequency for different external control voltages applied for several different temperatures of the oscillator when embodiments of the present disclosure are not applied.
Figure 5:
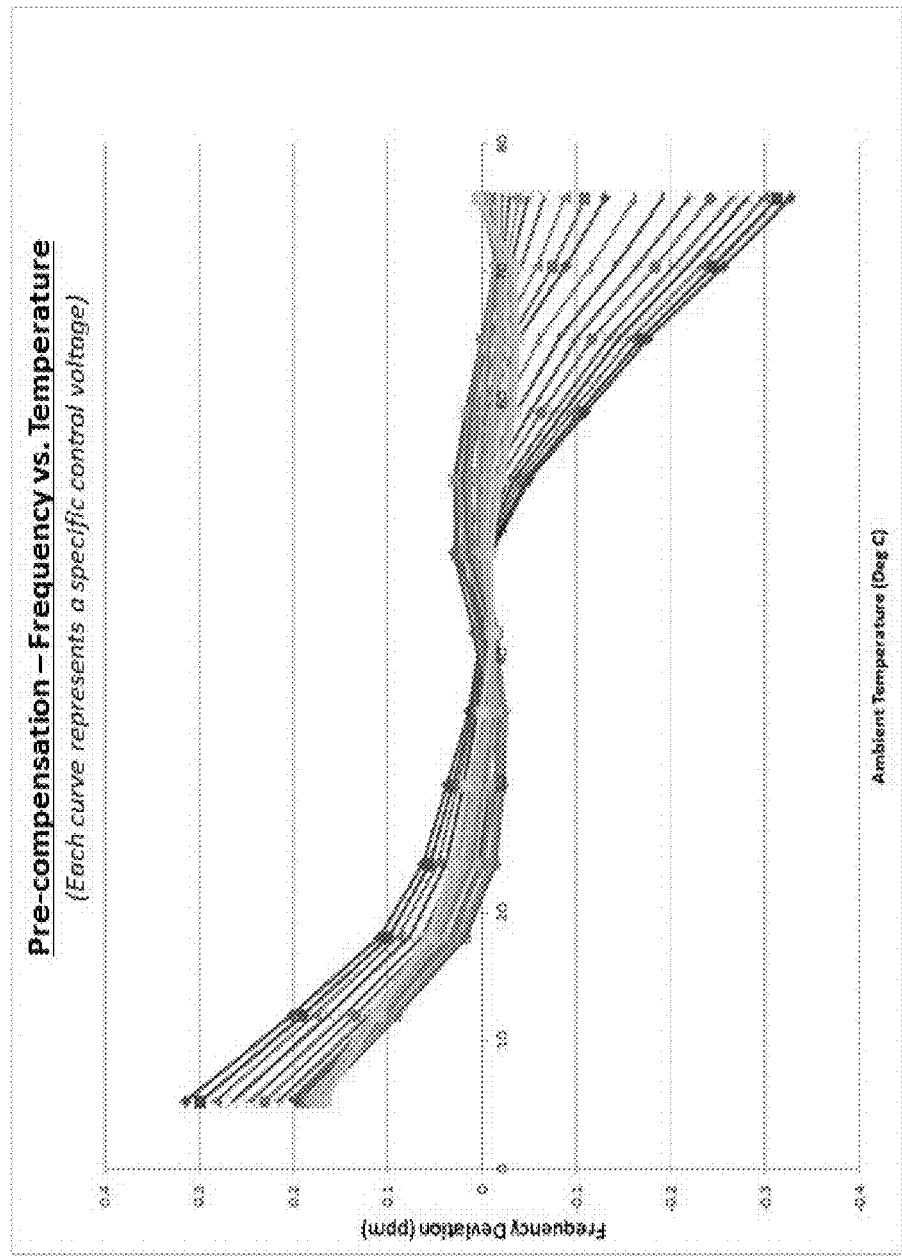
FIG. 5 illustrates the variance of the frequency output by the oscillator at different temperatures for several different applied external control voltages when embodiments of the present disclosure are not applied.

Moreover, the method may further include converting the temperature signal to a digital signal. Further, the method may further include generating a profile for the crystal oscillator based on one or more characteristics of the crystal oscillator. Generating the profile for the crystal oscillator may further comprise determining frequency versus temperature data and frequency versus voltage data across a temperature range. Across each selected temperature degradation (e.g., each degree or half degree, etc.) within the profile generation process, an external voltage control signal may be varied across a voltage range and the frequency of a resultant signal may be measured. FIGS. 4 and 5 illustrate examples of the generated results. Further, as selected temperatures, the internal voltage control signal may be varied and the frequency response can be measured or recorded. FIGS. 2 and 3 illustrate example results of the measurements.

In some cases, the method may further include weighting the internal voltage control signal to obtain a weighted internal voltage control signal and weighting the external control voltage signal to obtain a weighted external control voltage signal. The internal voltage control signal and the external control voltage signal may be weighted differently. Moreover, in some cases, the combination of the internal voltage control signal and the external control voltage signal comprises a combination of the weighted internal voltage control signal and the weighted external control voltage signal.

Further, the temperature of the crystal oscillator may be an internal temperature of the crystal oscillator that differs from an ambient temperature of a device that includes the crystal oscillator. Moreover, the frequency adjustment signal may be further based at least in part on a nominal frequency of the crystal oscillator. The frequency adjustment signal may be selected to be within a threshold delta from the nominal frequency. Further, in some cases, the internal voltage control signal is generated based at least in part on the external voltage control signal.

Although certain embodiments and examples are disclosed herein, inventive subject matter extends beyond the examples in the specifically disclosed embodiments to other alternative embodiments and/or uses, and to modifications and equivalents thereof.

DETAILED DESCRIPTION

It is desirable to compensate a quartz crystal oscillator for the unwanted frequency effects of temperature and trim skew. Trim skew may include a poor repeatability of the frequency-temperature response as the externally applied control voltage or the Electronic Frequency Control (EFC) is varied. The Electronic Frequency Control may also sometimes be referred to as Electric or Electrical Frequency Control. Typically, it is desirable that the frequency response resulting from changes in the EFC be linear in nature at any temperature.

Certain embodiments of systems that perform digital oscillator compensation may use multiple compensation schemes to independently address each individual cause of unwanted oscillator effects, such as, frequency deviation due to temperature, trim skew, and EFC non-linearity. Some TCXOs (temperature compensated crystal oscillators) do not have the capability to address trim skew and linearity, as their effects, while critical in high-precision systems, may be minor compared to temperature drift. The TCXOs are often used in Phase Locked Loop (PLL) applications, which typically are designed assuming a linear frequency response from the oscillator and thus, can be degraded by non-linearity effects. In some cases, the linearity is not an issue for some PLL applications. However, for many lower bandwidth PLL applications, non-linearity can cause performance of the PLL to suffer.

Some embodiments of systems that attempt to perform digital oscillator compensation employ stored lookup tables to compensate for temperature effects and, if trim skew compensation is applied, may often use imprecise hardware biasing to implement the trim skew compensation. Lookup tables may be limited in their efficiency and accuracy. Using a lookup table usually involves recalling a stored frequency adjustment value corresponding to the current temperature. The designer chooses the size of the temperature steps, which in turn defines the amount of non-volatile memory required for table storage. For example, if 5 degree temperature steps are chosen, typically there must be enough storage available to accommodate entries for each 5 degree step within the operating temperature range. If smaller steps are used, additional non-volatile memory may be required and testing time may be extended. Even then, while the resultant correction may be acceptable at the exact 5 degree temperature step, the effect between steps may be degraded. Sometimes, designers may apply a simple linear interpolation algorithm for temperatures between the table entries. However, this algorithm may not be accurate enough for crystal curves, which are inherently polynomial in nature. Typical TCXO responses to temperature can approach ±0.1 ppm/° C. (parts per million per degree Celsius) and are typically not linear. In some cases, even high-order polynomials employed in more complex compensation schemes may be unable to fit the temperature response accurately enough to achieve performance less than ±50 ppb (parts per billion) over an operating range of minus 40° C. (−40° C.) to plus 85° C. (+85° C.), which is often used as a standard industrial operating range.

Certain previously developed trim skew compensation systems degrade the spectral purity—phase noise and shortterm stability—of the oscillator's output. Advantageously, embodiments of the present disclosure do not degrade the spectral purity of the oscillator's output, or have negligible degradation which approaches the noise floor of current measurement equipment. Consequently, down-stream signal conditioning systems are unnecessary and can be eliminated, thereby reducing the size of the oscillator or systems that incorporate the oscillator.

Certain previously developed systems rely on external sensors to measure the oscillator's temperature. Advantageously, embodiments of the present disclosure use a temperature-compensated crystal oscillator that includes an internal temperature sensor. By incorporating the temperature sensor into the crystal oscillator's package, a more accurate measure of the temperature can be obtained resulting in more accurate compensation for temperature variation compared to existing systems.

In certain embodiments, a device employing embodiments of the disclosed compensation method may be implemented in a surface-mountable package or device (SMD). This device may be referred to as a packaged voltage-controlled temperature-compensated crystal oscillator (VCTCXO). Although the size of the surface-mountable package is not limited by the present disclosure, initial test units were implemented in a rectangular 9×14 mm surface-mountable package which is 5.4 mm high. However, the surface-mountable package may be larger or smaller based at least in part on the application-specific requirements for the unit. Further, the device employing the disclosed temperature compensation and trim skew compensation methods is not limited to a surface-mountable package and may be implemented in devices that use alternative form factors. For example, the packaged VCTCXO may be implemented as part of a through-hole (or thru-hole) package. Moreover, in some cases, the packaged VCTCXO may be implemented as part of a larger system in, for example, a multi-chip module. Further, the size of the device may vary. For example, the packaged VCTCXO may be implemented in a 5×7 mm package, a 23×36 mm package, a 1×1 inch square package or a 2×2 inch square package. The packaged VCTCXO may include a printed circuit board with an onboard TCXO, a microcontroller (MCU), one or more peripheral components, and a cover. Further, the disclosed compensation method may be implemented in custom test software and embedded MCU firmware.

FIG. 1A illustrates an embodiment of a packaged integrated voltage-controlled temperature-compensated crystal oscillator 100. The packaged integrated voltage-controlled temperature-compensated crystal oscillator 100 can include a voltage controlled temperature compensated crystal oscillator (VCTCXO) 102. The integrated voltage-controlled temperature-compensated crystal oscillator 100 may be an example of the packaged VCTCXO. The VCTCXO 102 can provide a clock signal that may be used with a number of clocked systems. Further, the VCTCXO 102 may be used with systems that require a high-degree of precision. For example, certain implementations of the VCTCXO 102 can maintain a clock rate within ±20 ppb, ±50 ppb, or ±100 ppb while operating in a temperature range of −40 to 85 degrees Celsius. While the VCTCXO 102 may be used with consumer electronics, such as laptops, smartphones, televisions, and the like, typically, an oscillator with the tolerances of the VCTCXO 102 are used with applications that require high-precision, such as military applications, space-programs, and satellite communications, and the like.

The packaged integrated voltage-controlled temperature-compensated crystal oscillator 100 may output a signal from the VCTCXO 102 via output port 104. This signal may be a clock signal used to clock one or more electronic devices (not shown) electrically connected to the integrated voltage-controlled temperature-compensated crystal oscillator 100. Alternatively, the signal may be provided to a post-processing electronic system that uses the signal to generate a clock signal.

The signal may be a temperature compensated signal which is compensated for variances in temperature and the operation of the VCTCXO 102. The VCTCXO 102 may include a temperature sensor 106. This temperature sensor 106 may output a temperature signal that corresponds to a temperature of the VCTCXO 102 and/or the ambient temperature of a portion of the integrated voltage-controlled temperature-compensated crystal oscillator 100 that includes the VCTCXO 102. This temperature signal may be an analog voltage signal or may be in the form of a digital signal supplied to a microcontroller unit (MCU) 108. The MCU 108 may include any type of hardware processor that can be used to calculate or determine a voltage control signal for configuring the VCTCXO 102. In some cases, the MCU 108 includes a general processor configured to calculate or determine the voltage control signal. In other cases, the MCU 108 includes an application-specific processor, such as a specially designed digital signal processor, for determining the voltage control signal.

The voltage control signal may be determined or calculated based at least in part on characteristics of a crystal oscillator included in the VCTCXO 102. In some cases, multiple crystal oscillators may share characteristics. For example, crystal oscillators may have similar type, cut, shape, or quality that can result in similar frequency versus temperature, supply voltage, or time curves. However, in other cases, the characteristics may be specific to the instance of the crystal oscillator. In other words, in some embodiments, each crystal oscillator may be unique and/or associated with unique characteristics that may vary to some degree compared to another crystal oscillator. In some embodiments, the uniqueness of the crystal oscillator may be due to natural variance in the material used to create the crystal oscillator and/or due to variance in the process that is used to manufacture the crystal oscillator. Often, the variances between two different crystal oscillators are negligible and, in some cases, can be treated as identical. However, for some applications, even minor variances in the characteristics of the crystal oscillator can be significant. For example, in military and/or space-based applications, variance in the characteristics of the crystal oscillator can result in significant operations differences. For instance, a variance in a temperature response of a crystal oscillator can affect the timing of systems used to control the operation of a spacecraft, which may determine whether landing the spacecraft is successful or not.

The MCU 108 may also receive an external control voltage that is provided to the integrated voltage-controlled temperature-compensated crystal oscillator 100. This external control voltage may be provided as an electronic frequency control (EFC) signal received from a feedback system. In some cases, the EFC signal may be received from a phase-locked loop or phase lock loop (PLL) of a communications apparatus. The PLL may be configured to maintain phase coherence of the output signal of the oscillator with a reference signal. The PLL can maintain the phase coherence by making adjustments to the EFC voltage supplied to the integrated voltage-controlled temperature-compensated crystal oscillator 100. These adjustments to the EFC voltage may be dynamic adjustments that are made continuously or intermittently. The EFC voltage may be used to maintain the frequency of the oscillator around its nominal frequency, which may sometimes be referred to as its nameplate frequency. The nominal frequency may be the desired central frequency of the VCTCXO 102.

In some implementations, the PLL (not shown) and the integrated voltage-controlled temperature-compensated crystal oscillator 100 may be integrated or included as one package. In other implementations, the PLL and the integrated voltage-controlled temperature-compensated crystal oscillator package 100 may be two separate packages, which in some cases may be included together as part of a MCM. Further, in some implementations, the PLL, the integrated voltage-controlled temperature-compensated crystal oscillator 100, or the combination of the two may be included as part of a transceiver, such as for a wireless device, a cellular tower, a satellite communications system, or any other type of communications system.

In certain embodiments, the PLL may be optional or omitted. For example, the EFC voltage may be received as a constant voltage from a voltage source or from a control system. Further, in some cases, the EFC may be provided as part of a static frequency adjustment and thus, may be a static input. In some cases, the static input may be varied over time, but may not include the continuous or intermittent dynamic adjustments described above. For example, the static input may be modified during a calibration procedure for a system incorporating the integrated voltage-controlled temperature-compensated crystal oscillator 100. The calibration procedure may update the static EFC voltage applied to the integrated voltage-controlled temperature-compensated crystal oscillator 100 to compensate for aging effects of the crystal included in the VCTCXO 102 that can cause the frequency of the oscillator to change over time. Although described with respect to the static EFC voltage, it should be understood that the EFC voltage may be adjusted to account for the aging effect in a system that uses a dynamic EFC voltage.

The MCU 108 may include an Analog to Digital Converter (ADC) 110 that converts one or more of the temperature signal or the EFC signal to a digital signal. In certain embodiments, the ADC 110 is optional or omitted. For example, if the temperature signal and the EFC signal are both digital signals, the ADC 110 may be omitted.

The MCU 108 may include a non-volatile memory 112 that stores a profile of the crystal oscillator included in the VCTCXO 102. The profile may include characteristics of the crystal oscillator including, for example, a variance in a signal that can be generated by the crystal oscillator over a particular temperature profile, the stability of the signal, the repeatability of the signal, and the like. Further the profile may include characteristic information relating to the frequency of the crystal oscillator. For instance, the profile may include frequency vs acceleration information; frequency over time (e.g., the aging effect), frequency vs EFC voltage for the VCTCXO 102, frequency vs supply voltage for the VCTCXO 102, and the like. Alternatively, or in addition, the non-volatile memory 112 may store a polynomial array, which stores coefficients associated with the frequency response of the crystal oscillator for a number of temperature values and control voltage values. This polynomial array may be a multi-dimensional polynomial array. The temperature, T, and the EFC voltage, V, may be supplied as inputs to the polynomial array to determine the frequency, F, of the VCTCXO 102. Thus, the frequency response may be determined as a function of the temperature of the VCTCXO 102 and the EFC voltage applied to the VCTCXO. The T and V may serve as two independent variables. F vs. T can be described as one set of one or more polynomials and F vs V can be described as another set of one or more polynomials. The result of the set of F vs T polynomials can be used to generate the set of F vs V polynomials. By modeling F in two dimensions, it is possible to minimize the result of the F vs T polynomials while linearizing the F vs V polynomials. Further, the MCU 108 may include a calibration interface 114 for configuring the MCU 108 and/or for providing a profile of the crystal oscillator for storage at the memory 112. In some embodiments, the calibration interface 114 may be used to receive frequency error coefficients $a_{[t][n]}$, which are described in more detail below, and which may be stored on the memory 112.

The MCU 108 may output a signal associated with maintaining the stability of the signal generated by the crystal oscillator for a particular internal temperature of the crystal oscillator. This signal may be an adjustment to the voltage applied to the crystal oscillator. Alternatively, the signal may be an indication that no change should be made to the voltage applied to the crystal oscillator of the VCTCXO 102. Usually, the output is a voltage (e.g., an internal control voltage) that may be combined with the EFC voltage. The crystal oscillator of the VCTCXO 102 may generate a signal of a particular frequency (e.g., a nominal frequency). The voltage applied to the VCTCXO 102 can be used to steer or adjust the frequency up or down within some frequency range or delta of the nominal frequency. For example, the nominal frequency of a crystal may be 40 MHz. The applied voltage may be capable of adjusting the frequency by +/−200 Hz. The frequency of the crystal oscillator may be based on a number of factors including the type of crystal and its cut. The frequency of the crystal can range between several kilohertz to hundreds of MHz, or more.

In some embodiments, the signal output by the MCU 108 is an analog signal. However, in other cases, the signal is a digital signal. In some such cases, the digital signal may be supplied to a Digital to Analog Converter (DAC) 116 and converted to an analog signal. The analog signal may serve as an internal control voltage for controlling the VCTCXO 102. The internal control voltage signal may be combined with the external control voltage received at the EFC input using a combiner 118. The combiner 118 may be an adder that combines the internal and external control voltages using superposition. However, the combiner 118 is not limited as such and may use any other method to combine the internal and external control voltages. For example, the combiner 118 may average the signals or apply one or more weights to the signals before combining them. For example, the internal control voltage may be weighted 1.5× or 2× compared to the external control voltage.

The output of the combiner 118 may be applied to the VCTCXO 102 to modify the operation of the VCTCXO 102. The combination of the internal control voltage and the EFC voltage may be used to adjust the output frequency of the VCTCXO 102 around its nominal frequency. The output of the combiner may be referred to as a frequency adjustment signal. The nominal frequency of the VCTCXO 102 may be based on the type, cut, shape, and quality of the crystal used within the VCTCXO 102. Temperature, aging and trim skew may affect the frequency output by the VCTCXO 102. The applied voltage output by the combiner 118 may be used to adjust the output frequency to be at or closer to the nominal frequency of the crystal or VCTCXO 102. The voltage is typically selected to bring the frequency output by the VCTCXO 102 within a threshold difference of the nominal frequency. This voltage may be applied to a varactor or other circuit element included in the VCTCXO 102. The varactor, or varicap diode, may serve as a voltage-controlled capacitor for the VCTCXO 102. Typically, as the voltage output by the combiner 118 increases, the frequency output by the VCTCXO 102 increases. However, in certain embodiments, the frequency of the VCTCXO 102 can be configured to decrease. The change in the voltage applied to the VCTCXO 102 may modify the frequency of the signal output via the output port 104. Generally, the frequency output by the output port 104 may be a combination of the voltage controlled (VC) portion of the VCTCXO 102, the temperature correction (TC) caused by the application of the internal control voltage, and the crystal frequency (XO) itself. Thus, the VCTCXO can be the combination of VC+TC+XO.

As stated above, the voltage applied to the VCTCXO 102 may be a combined voltage output by the combiner 118 that combines both the external voltage and the internal control voltage determined by the MCU 108. The resultant weighted sum of the internal and external control voltages may be the electronic frequency control (EFC) voltage that can be applied to the VCTCXO 102. The voltage applied to the VCTCXO 102 may be applied to a varactor or variable capacitance diode of the VCTCXO 102. In some embodiments, the external voltage and the internal control voltage may be combined in different ratios. Typically, the external control voltage is weighted more than the internal control voltage. Thus, usually the external control voltage may have a greater impact on the frequency of the VCTCXO 102 than the internal control voltage. The external control voltage may be selected to generate the desired frequency for the VCTCXO 102 and may be able to adjust the frequency with greater magnitude than the internal control voltage. The internal control voltage may be selected to reduce or eliminate undesirable effects on the VCTCXO 102, such as unwanted trim skew and temperature effects. In some implementations, the combiner 118 may be a voltage combiner circuit that includes different resistors for each input voltage so as to modify the ratio of the external control voltage to the internal control voltage.

Typically the ratio of the voltages is constant, but the value of the internal control voltage may be changed based, at least in part, on the temperature reading of the temperature sensor 106. However, in some cases, the resistors of the combiner 118 may be variable resistors enabling the ratio of the EFC voltage and the internal control voltage to be modified during manufacture or operation of the VCTCXO.

The temperature value may be supplied to the MCU 108 as an analog voltage or as a digital value corresponding to the measured temperature. The MCU 108 can access a set of polynomial coefficients stored in the memory 112 based on the temperature detected by the temperature sensor 106. The MCU 108 can apply the coefficients to the EFC voltage to determine the internal control voltage.

As one crystal used in a crystal oscillator may differ from another crystal oscillator, the profile of each crystal oscillator may differ. Thus, the profile information or polynomial array stored in the memory 112 of the MCU 108 may differ for each crystal oscillator.

Figure 1C:
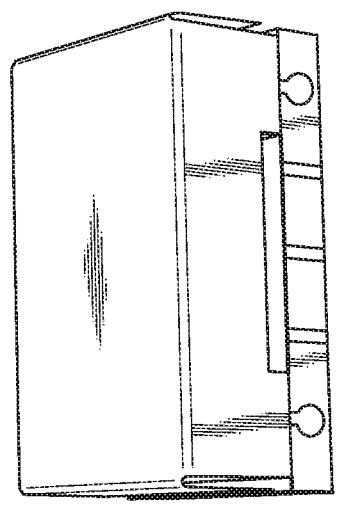
FIG. 1C illustrates an embodiment of the test fixture of FIG. 1B mounted on a test board.
Figure 1B:
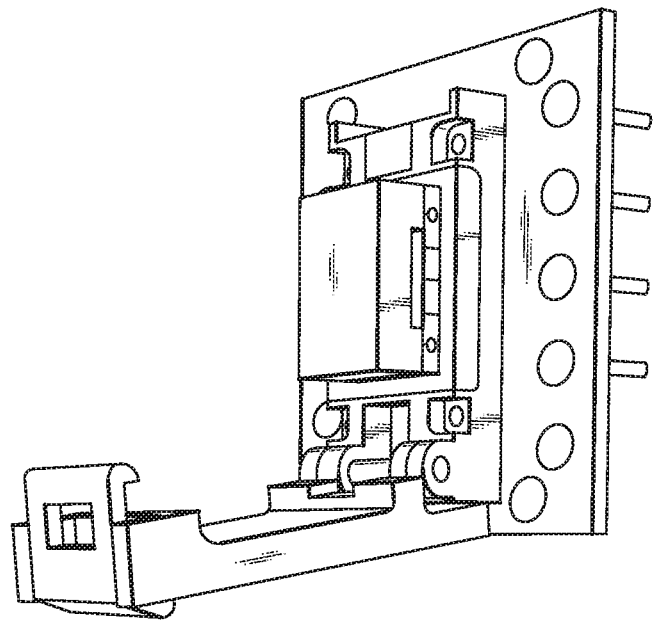
FIG. 1B illustrates an embodiment of a VCTCXO mounted in a test fixture.

In some embodiments, to determine the profile information for the crystal of the crystal oscillator, the VCTCXO 102 may be mounted to a test fixture inside of a temperature chamber. FIG. 1B illustrates the VCTCXO 102 mounted in a test fixture. FIG. 1C illustrates the test fixture mounted on a test board, which may be placed in a temperature chamber to determine a profile or a frequency profile for the VCTCXO mounted on the test fixture. The frequency profile may include the frequency of a signal output by the VCTCXO for different temperature values and/or voltage input values (e.g., EFC voltages) applied to the VCTCXO. To determine the frequency profile, a temperature profile may be applied to the VCTCXO using the temperature chamber. The temperature profile may include a range of temperatures within which it may be desired that the VCTCXO operate (e.g., the desired operating or operational temperature range described below).

To determine the frequency profile of the VCTCXO 102, the test fixture is placed in an oven and the frequency of the VCTCXO is determined across a range of temperatures (e.g., the temperature profile) applied to the VCTCXO. By applying the range of temperatures to the VCTCXO while measuring the frequency, it can be determined how temperature affects the frequency of the signal produced by the VCTCXO. Often, the temperature range applied to the VCTCXO is determined based on a desired operational temperature range of the VCTCXO 102. The desired operational temperature range may vary based on the application for the VCTCXO 102. For example, some industrial applications have a desired operational range of −40° C. to 85° C. while some other industrial applications and some automotive applications have a requirement for an extended operational range of −40° C. to 125° C. Many military applications require an operational temperature range of −55° C. to 125° C. In some cases, the VCTCXO may be designed to include an additional tolerance beyond the desired operational range.

Automated frequency, internal temperature, and control voltage measurements may be taken at particular temperature steps (which may be predetermined in some cases), while the applied control voltage is varied. The more frequent the readings and the closer the temperature steps, the more accurate the profile that can be obtained for the VCTCXO 102. However, because each crystal oscillator can be unique, it is often not practical to use overly fine increments in temperature and frequency measurements of the VCTCXO for volume manufacturing. Thus, the temperature increments or the frequency of measurements of a VCTCXO being manufactured may vary based on a number of factors including, the number of VCTCXOs being manufactured, the desired customer specifications, or the cost of the VCTCXO. For example, the temperature of the VCTCXO may be adjusted from the minimum to the maximum desired operational temperature (or vice versa) in 2° C. increments. Further, the temperature may be maintained at a particular value for a particular time period, such as 6 minutes.

Once the measurements of the frequency of the VCTCXO are obtained for different temperatures and application voltages, It is possible to calculate piecewise polynomial curves covering some or all temperatures and control voltages which will keep the frequency stable under some or all conditions, while linearizing the control voltage effect over its entire range. This may be accomplished using a multi-dimensional polynomial array which uses the measured internal temperatures to curve fit the frequency response across the control voltage range. The calculated polynomial coefficients for each individual device may be stored in the non-volatile memory 112 of the microcontroller 108 as, for example, 64-bit double-precision floating point values. These values may then be used in real time to generate a compensating internal control voltage via a digital-to-analog converter (DAC) 116, whose output may be summed using the combiner 118 with an externally applied control voltage.

FIG. 1D illustrates an example implementation of the integrated voltage-controlled temperature-compensated crystal oscillator 100 on a printed circuit board. As illustrated, the integrated voltage-controlled temperature-compensated crystal oscillator 100 may be a multi-chip module (MCM) that includes the VCTCXO, a microcontroller, and a Digital to Analog Converter. Although not shown, the PCB may further include a memory for storing the coefficients used by the microcontroller. Alternatively, the memory may be on a separate PCB or may be integrated into the microcontroller. The microcontroller may use coefficients stored in the memory to generate an internal control voltage for the VCTCXO.

Equation 1 may be used to generate the internal control voltage:

$$P(T,V)=f(T,V)*g(T,V)=a_{[i][n]}V^n+a_{[i][n-1]}V^{n-1}+\ldots+a_{[i][1]}V+a_{[i][0]} \quad (1)$$

where i indexes T and n represents the polynomial order. The value P(T,V) represents the internal control voltage and is determined by calculating a polynomial dependent on the functions f(T,V) and $g_{[i][j]}(T,V)$, where (T) is the temperature, and (V) is the external control voltage. The coefficients $a_{[i][n]} \ldots a_{[i][0]}$ model the product of f(T,V) and $g_{[i][j]}(T)$. The value P(T,V) is a control voltage and can be determined as a product of the functions f and g. In other words, P(T,V) can be calculated as follows:

$$P(T,V)=f(T,V)*g_{[i][j]}(T,V) \quad (2)$$

The value P(T,V) is based on the frequency error of the VCTCXO at a temperature and voltage times the sensitivity of the device at that temperature and voltage. This error represents a deviation from the nominal frequency of the oscillator. In other words, regardless of the temperature as the EFC voltage applied to the oscillator changes, the output frequency should change predictably. In some cases, the output frequency may be predictable because of a linear relationship between the EFC voltage and the output frequency. In other cases, the output frequency may have a non-linear relationship with the EFC voltage, but may still be predictable. However, due to temperature affects and trim skew, the change in frequency is not always predictable. This change may be referred to as the error of the VCTCXO for a particular voltage and temperature. The nominal value of the VCTCXO may be determined during testing and can be selected as the average or median value of the results of testing the VCTCXO in the oven across at a particular temperature or across a range of temperatures. In some cases, the values obtained during testing at different temperatures or voltages are normalized and then the normalized values are used to determine the baseline or nominal frequency for the VCTCXO. Deviations from this nominal frequency can be categorized as the error.

In certain embodiments, the coefficients $a_{[i][n]}$ determined while testing the VCTCXO 102 are stored in the memory 112 of the MCU 108. The coefficients may be determined and stored for up to fifth order. However, the disclosure is not limited as such and higher order coefficients may be determined and stored at the MCU 108. Although calculating higher order coefficients may improve the accuracy of the VCTCXO 102 during operation, it also may require additional processing cycles and memory storage. Using the coefficients $a_{[i][n]}$ with the control voltage EFC as the independent variable, a polynomial can be created or generated, which may be applied to the measured control voltage. The calculation of the polynomial provides the internal control voltage for the VCTCXO 102 of the integrated voltage-controlled temperature-compensated crystal oscillator 100.

The function f(T,V) may be represented by the equation 3:

$$f(T,V)=b_{[j]}(T)-\text{median}(b_{[j]}(T\text{max})\ldots b_{[j]}(T\text{min})) \quad (3)$$

where j indexes V. Equation 3 may calculate a normalized uncompensated frequency error, or the frequency deviation from the nominal frequency of the oscillator caused by temperature. This data is collected during the characterization process and is normalized to the median reading over (T) collected for a particular (V). The values $b_{[j]}$ represent the change in frequency, $\Delta f$, normalized by the nominal frequency, $f_n$, of the oscillator ($\Delta f/f_n$) at a particular voltage. And $b_{[j]}(T)$ represents the frequency change caused by temperature. Thus, the frequency error may be determined by subtracting the median frequency at a particular voltage from the frequency at the particular voltage and at a particular temperature. The data itself is the basis for the temperature correction, while the normalization of the data allows for the reduction or elimination of trim skew effects caused by varying (V) and linearizes the EFC response.

The functions $g_{[i][j]}(T,V)$ are a set of polynomials dependent on (T) and (V) and may be calculated using equation 4:

$$g_{[i][j]}(T,V)=c_{[i][j][m]}T^m+c_{[i][j][m-1]}T^{m-1}+\ldots+c_{[i][j][1]}T+c_{[i][j][0]} \quad (4)$$

where i indexes T, j indexes V, and m is the polynomial order. The function g(T,V) may describe the variation in oscillator sensitivity (e.g., the change in frequency versus the control voltage or the EFC voltage) depending on temperature and control voltage magnitude over all, or a set of, temperatures and voltages. Thus, g(T,V) can be calculated as a summation of smaller functions using equation 5:

$$g(T,V)=\Sigma_{i=i_o, j=j_o}^{i\max, j\max} g[i][j](T,V) \quad (5)$$

where i indexes temperature and ranges from the minimum to maximum temperature to be supported by the oscillator and j indexes the control voltage, which is stepped from the minimum to the maximum control voltage or EFC voltage for the particular oscillator unit or system. The coefficients $c_{[i][j][m]} \ldots c_{[i][j][0]}$ may be calculated using the maximum pull ranges of the oscillator across the operating temperature range. The pull range may refer to the range of frequency deviation that can be obtained by sweeping the EFC voltage from its minimum to maximum values (or vice versa) and may sometimes be referenced in parts per million (ppm) or parts per billion (ppb). FIG. 2 illustrates the sensitivity of an oscillator to different external control voltages applied at select temperatures that correspond to a desired temperature operational range. The functions $g_{[i][j]}(T,V)$ interpolate between selected values of (T) and (V) by modeling the oscillator sensitivity (ppm/V) over all temperatures, or all temperatures within a particular range and at a particular granularity. FIG. 3 illustrates the sensitivity of an oscillator to different temperatures at select external control voltages that correspond to a desired voltage operational range.

In some embodiments, a spreadsheet, a lookup table, or other software application may be used to populate an array of values. The array of values may be an array of temperature vs applied control voltage vs the peak-to-peak voltage range supported by the DAC 116. First, the VCTCXO's 112 coarse sensitivity (ppm/V) may be measured using a set of selected external control voltages and temperatures. In other words, the coarse sensitivity is measured based on the selected step size for the external control voltage. For example, the step size may be per volt, or per 500 mV, or per 100 mV, etc. The coarse sensitivity may be modeled with parabolic functions over the external control voltage range. FIG. 2 and FIG. 3 illustrate the measurements of the oscillator sensitivity over different temperature and external voltage ranges. The parabolic coefficients may be modeled themselves with quadratic polynomials—$g_{[i][j]}(T,V)$ as defined by equation 4—and can be used to predict the fine sensitivities (ppm/bit) of the oscillator's response to the internally generated control voltage (supplied by the DAC) at any temperature. In certain embodiments, the fine sensitives can be determined by interpolating the ppm/V between the external control voltage values used for measuring the coarse sensitivity. For example, if the coarse sensitivity is measured every 100 mV, the fine sensitivity can be interpolated between each 100 mV step.

Figure 6:
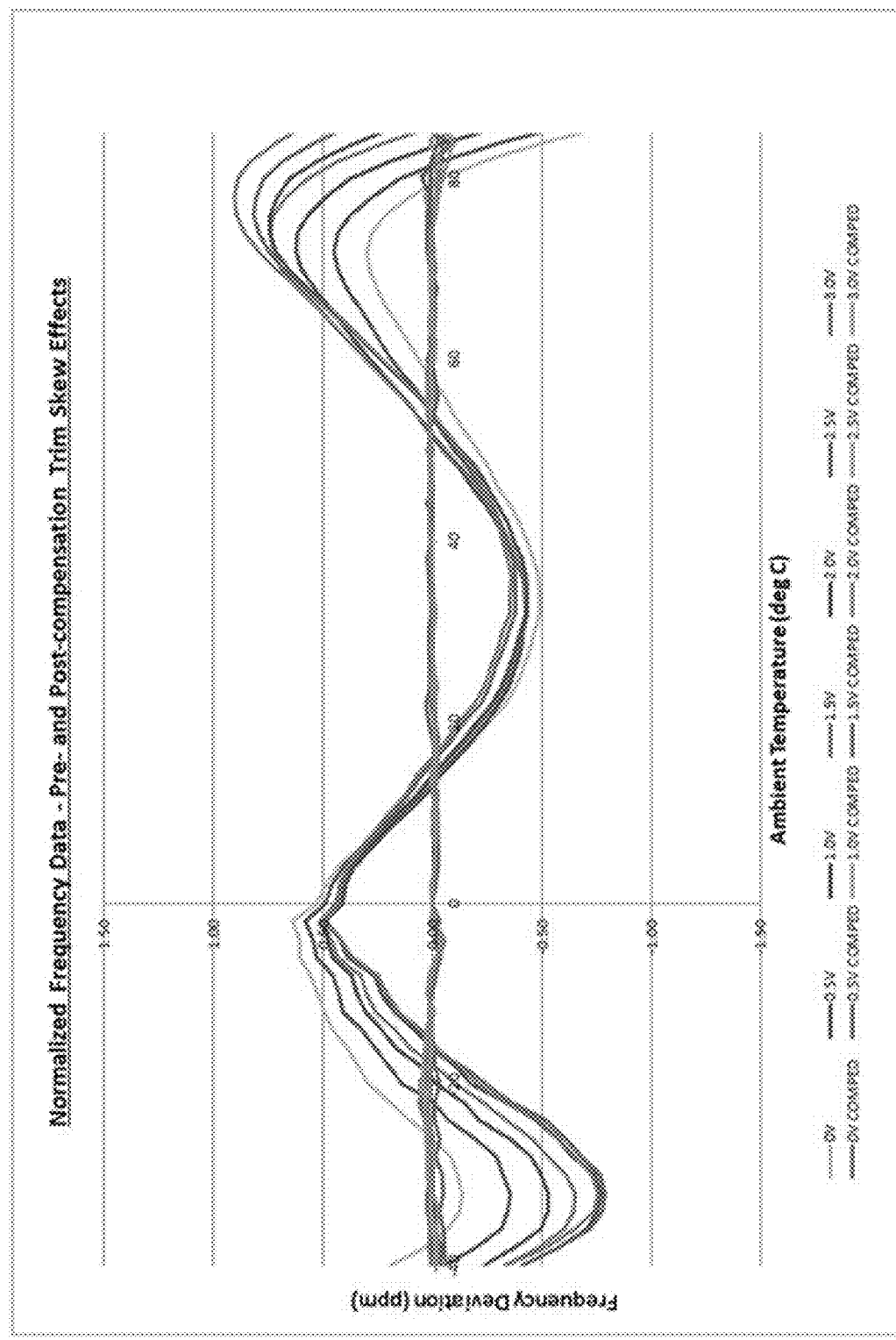
FIG. 6 illustrates the difference in the variance of the frequency output by the oscillator at different temperatures for several different applied external control voltages when not applying embodiments of the present disclosure with when applying embodiments of the present disclosure.

The temperature sensor 106 of the VCTCXO 102 can measure the internal temperature of the VCTCXO. This internal temperature and the applied external control voltage may be used to calculate the resultant frequencies, $f(T,V)$, using equation 3. The resultant frequency and the quadratic polynomials determined using equation 4 can be multiplied using equation 1 to calculate internal correction voltages, represented by $P(T,V)$, for the VCTCXO 102. The internal correction voltages, or internal control voltages, can be used to cancel undesirable effects (such as frequency drift or trim skew) under the desired operating conditions. For example, FIG. 6 illustrates the reduction of trim skew or frequency deviation for a number of voltages over a temperature range. Applying the internal correction voltages, the frequency variation can be reduced from approximately ±0.5 to substantially 0 ppm as illustrated in FIG. 6. The measured temperature may be used to correct for trim skew, because, for example, the trim skew at each temperature may be simpler to model than the temperature response over the control voltage range. Further, using the measured temperature to solve for the trim skew correction may provide a more accurate result than modeling the temperature effects directly.

The calculated correction voltages can be modeled themselves with low-order polynomials across overlapping piecewise temperature regions. The order of the fit, along with the size and number of regions, may be chosen so that the models between adjacent regions are both continuous and linear, or substantially linear. The measured temperatures and calculated coefficients, which may be unique for each device oscillator, may be stored in the non-volatile memory 112. Subsequently, at adjustable intervals, the internal temperature and external control voltage may be measured, and the coefficients stored in the non-volatile memory 112 may be used to calculate an appropriate internal correction voltage.

In certain embodiments, depending on the measured temperature (T), corresponding sets of nth-order polynomial coefficients (e.g., $a_{[i][n]}$ from equation 1) may be recalled from memory. In some cases, two sets of coefficients are recalled: one set ($a_{[i][n]}$ through $a_{[i][0]}$) corresponding to the stored temperature ($T_0$) which is a temperature closest to, but less than the current measured temperature, and another set ($a_{[i+1][n]}$ through $a_{[i+1][0]}$) corresponding to the next higher stored temperature ($T_1$). These two sets of coefficients may be applied to the measured external control voltage (V), generating two internal correction voltages $P(T_0,V)$ and $P(T_1,V)$. The internal correction voltage $P(T,V)$ which is ultimately applied (in conjunction with the external control voltage), may be derived along a linear slope $(P(T_1,V)-P(T_0,V))/(T_1-T_0)$ between the two points, where $P(T,V)=P(T_0,V)+(P(T_1,V)-P(T_0,V))*(T-T_0)/(T_1-T_0)$.

The internal correction voltage may be supplied to the DAC 116 and then combined with the external control voltage using the combiner 118. Further, the internal correction voltage (or internal control voltage) may be used to cancel errors in the generation of the oscillator signal, enabling the VCTCXO 102 to maintain a very precise frequency under multiple voltage and temperature conditions. For example, using the internal correction voltage, a VCTCXO 102 configured to produce a 40 MHz signal may be maintained, under multiple voltage and temperature conditions, within 2 or 3 Hz, or less, of the 40 MHz signal. However, in other cases, the frequency may vary by more than 3 Hz. In some cases, the amount of variance with respect to the frequency output by the VCTCXO may vary with respect to the size, cost, or power consumption of the VCTCXO 102. Typically, a more precise VCTCXO will be larger. Thus, there is often a trade-off between the desired size or cost of the VCTCXO and the desired precision of the output frequency.

Devices have been built and tested illustrating the efficacy of the above disclosed method. Test data has shown frequency variation of the VCTCXO across a range of operational temperatures reduced from approximately ±0.7 ppm to ±20 ppb, which is an improvement of 35×. Trim skew effects have been reduced from ±125 ppb to ±5 ppb, a 25× improvement. A further profound effect of this particular disclosure is the linearization of the external control voltage response.

FIG. 4 illustrates the trim skew effects and non-linearity of an oscillator's output frequency for different external control voltages applied for several different temperatures of the oscillator when embodiments of the present disclosure are not applied. FIG. 5 illustrates the variance of the frequency output by the oscillator at different temperatures for several different applied external control voltages when embodiments of the present disclosure are not applied.

Figure 7:
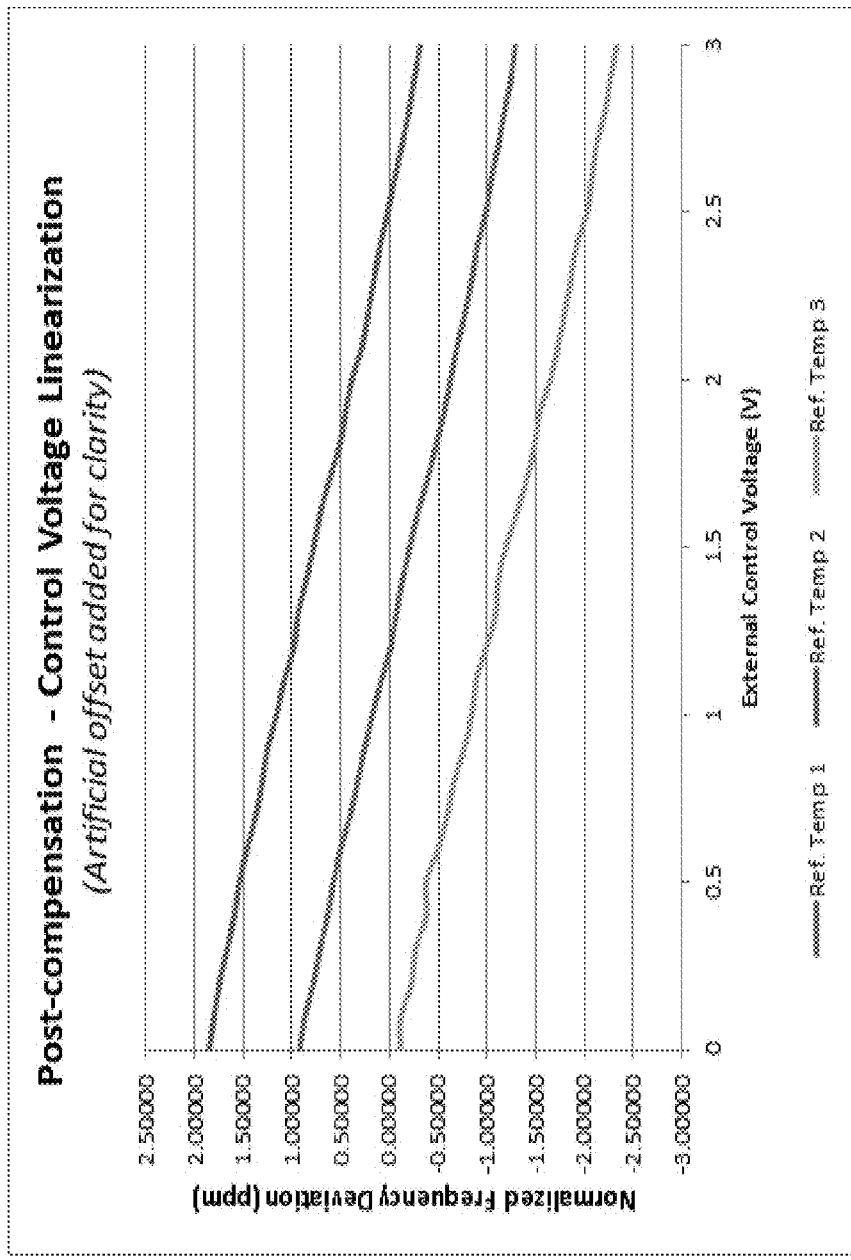
FIG. 7 illustrates the linearization of the Electronic Frequency Control response when embodiments of the present disclosure are applied to the VCTCXO.

FIG. 6 illustrates the difference in the variance of the frequency output by the oscillator at different temperatures for several different applied external control voltages when not applying embodiments of the present disclosure with when applying embodiments of the present disclosure. As illustrated in FIG. 6, there is a significantly greater variance in output frequency when embodiments of the present disclosure are not applied to compensate for trim skew compared to when the internal control voltage is calculated and applied to the VCTCXO using the embodiments disclosed herein. FIG. 7 illustrates the linearization of the trim skew when embodiments of the present disclosure are applied to the VCTCXO.

FIG. 7 represents normalized frequency deviation for different temperatures and EFC voltages applying the internal control frequency compensation process disclosed herein. The three different lines represent different temperature values. An artificial offset was added to temperature lines to separate the lines for illustrative purposes. However, if the offset were removed, each of the lines would be roughly at the same normalized frequency deviation across the different EFC voltages. In other words, the lines in FIG. 7 would be atop one another.

Although a particular form factor has been disclosed, it should be understood that embodiments disclosed herein may be applied to frequency control devices in many form factors, with varying operating temperature ranges and other technical requirements. Further, this disclosure allows for unparalleled frequency stability with a minimal footprint and low power requirements.

The compensation method described herein allows a TCXO to out-perform many existing OCXO's while reducing physical size and power requirements. It produces ultra-smooth correction which may be continuous under all conditions, and may be accurate to less than 0.1° C. of external temperature variation and sub-mV changes to the externally applied control voltage. Further, the compensation for all sources of frequency deviation may be combined into a single algorithm.

Example Crystal Oscillator Control Process

Figure 8:
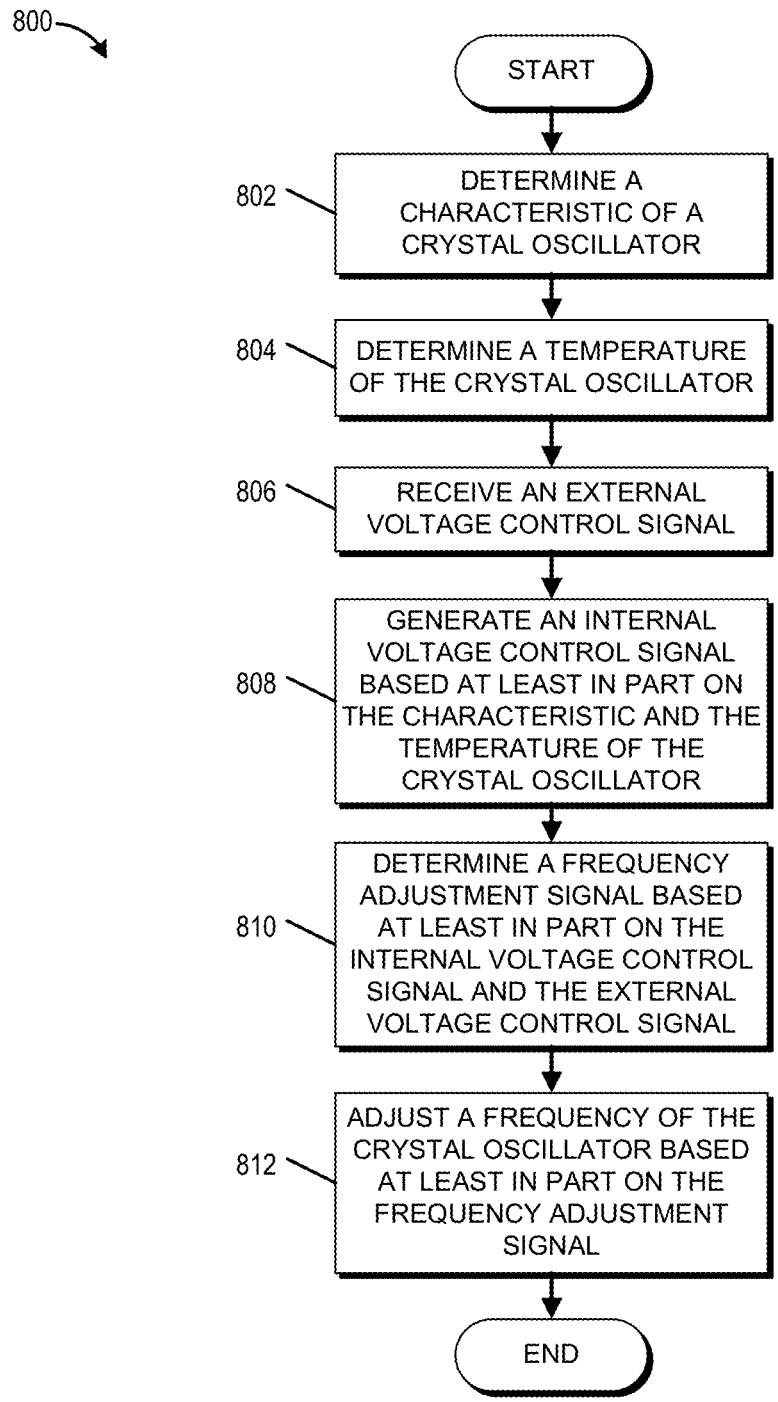
FIG. 8 presents a flowchart of an embodiment of a crystal oscillator compensation process.

FIG. 8 presents a flowchart of an embodiment of a crystal oscillator control process. The process 800 can be implemented by any system that can control a crystal oscillator to output a signal or modify the output of a signal from the crystal oscillator, such as the VCTCXO 102. The process 800, in whole or in part, can be implemented by, an MCU 108, a VCTCXO 102, or a controller that is external or internal to the packaged integrated voltage-controlled temperature-compensated crystal oscillator 100, among others. Although any number of systems, in whole or in part, can implement the process 800, to simplify discussion, the process 800 will be described with respect to particular systems. Further, it should be understood that the process 800 may be updated or performed repeatedly over time. For example, the process 800 may be repeated every minute, every 5 minutes, in response to a command, each time an external voltage control signal changes, each time a temperature of the VCTCXO 102 changes a threshold amount, or based on any other trigger that may cause the process 800 to be performed or repeated.

The process begins at block 802 where, for example, a characteristic of a crystal oscillator is determined. In some cases, the block 802 may include determining a profile of the crystal oscillator that includes a number of characteristics of the crystal oscillator. These characteristics may refer to physical characteristics of the crystal oscillator, such as the shape or clarity of the crystal oscillator, or electrical characteristics of the crystal oscillator, such as a frequency produced by the crystal oscillator in response to receiving a voltage signal at one or more different temperatures. In some cases, the characteristics may include both physical and electrical characteristics. Further, in some cases, determining a characteristic of the crystal oscillator may include determining of the frequency of the signal applied to the crystal oscillator across a range of temperatures. This temperature range may be produced by adjusting the temperature of an oven within which the crystal oscillator is placed.

In some embodiments, the block 802 may include accessing a profile of the crystal oscillator stored at a memory, such as the memory 112. In some cases, the profile may be stored as part of a lookup table.

At block 804, the MCU 108 determines a temperature of the crystal oscillator. The temperature of the crystal oscillator may be determined based on a measurement from a temperature sensor 106 included in the VCTCXO 102. In some cases, a signal received from the temperature sensor 106 provides an indication of the temperature of the VCTCXO 102. In other cases, a voltage signal is received that corresponds to a particular temperature. In such cases, the MCU 108 may determine the temperature of the VCTCXO 102 by determining a temperature associated with the received voltage signal. As the temperature determined by the MCU 108 is based on a signal received from the temperature sensor 106, the temperature reading corresponds to an internal temperature of the VCTCXO 102 rather than in ambient temperature of a device that includes the crystal oscillator. Thus, the temperature reading for the crystal oscillator may be more precise than systems that do not include a temperature sensor with the crystal oscillator.

At block 806, packaged integrated voltage-controlled temperature-compensated crystal oscillator 100 receives an external voltage control signal. In some cases, this external voltage control signal is an EFC signal. In other cases, the EFC signal is a combination of the external voltage control signal and the voltage control signal determined at the block 808 described below. The external voltage control signal may be received from a feedback system, a PLL, an external control system, or other external system that includes the packaged integrated voltage-controlled temperature-compensated crystal oscillator 100.

At block 808, MCU 108 generates a voltage control signal based at least in part on the characteristic determined at the block 802 and the temperature of the crystal oscillator determined at the block 804. In some cases, the voltage control signal is generated based at least in part on a profile of the crystal oscillator. Generally, each crystal oscillator will be associated with a unique profile corresponding to unique characteristics of the crystal oscillator. Generating the voltage control signal may include determining a voltage for the signal based at least in part on a lookup table indexed by one or more of the temperature of the crystal oscillator in the characteristic of the crystal oscillator. In some embodiments, lookup table may include one or more polynomials associated with the crystal oscillator. The one or more polynomials may be solved to determine the voltage control signal using one or more of the temperature of the crystal oscillator in the characteristic of the crystal oscillator as values for variables or coefficients of the one or more polynomials. In some embodiments, the polynomials stored in the memory 112 of the MCU 108 may be specific to the particular VCTCXO 102 and may be determined based at least in a profile of the VCTCXO 102.

At block 810, a frequency adjustment signal is determined based at least in part on the voltage control signal and the external voltage control signal. This frequency adjustment signal may be determined by combining the voltage control signal and the external voltage control signal using a combiner 118. Further, in some cases, a weight may be applied to the voltage control signal, the external voltage control signal, or both the voltage control signal and the external voltage control signal. The combiner 118 may apply the weights to the signals or may be used to combine the weighted signals.

At block 812, a frequency of the crystal oscillator is adjusted based at least in part on the frequency adjustment signal determined at the block 810. Adjusting the frequency of the crystal oscillator may include applying the frequency adjustment signal, which may be an EFC signal, to the VCTCXO 102. Applying the frequency adjustment signal to the crystal oscillator may result in the adjustment of the signal output at the output port 104 of the packaged integrated voltage-controlled temperature-compensated crystal oscillator 100.

Terminology

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

All of the processes described herein may be embodied in, and fully automated via, software code modules executed by a computing system that includes one or more computers or processors. The code modules may be stored in any type of non-transitory computer-readable medium or other computer storage device. Some or all the methods may be embodied in specialized computer hardware.

Many other variations than those described herein will be apparent from this disclosure. For example, depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially. In addition, different tasks or processes can be performed by different machines and/or computing systems that can function together.

The various illustrative logical blocks and modules described in connection with the embodiments disclosed herein can be implemented or performed by a machine, such as a processing unit or processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor can be a microprocessor, but in the alternative, the processor can be a controller, microcontroller, or state machine, combinations of the same, or the like. A processor can include electrical circuitry configured to process computer-executable instructions. In another embodiment, a processor includes an FPGA or other programmable device that performs logic operations without processing computer-executable instructions. A processor can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor may also include primarily analog components. For example, some or all of the signal processing algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Any process descriptions, elements or blocks in the flow diagrams described herein and/or depicted in the attached figures should be understood as potentially representing modules, segments, or portions of code which include one or more executable instructions for implementing specific logical functions or elements in the process. Alternate implementations are included within the scope of the embodiments described herein in which elements or functions may be deleted, executed out of order from that shown, or discussed, including substantially concurrently or in reverse order, depending on the functionality involved as would be understood by those skilled in the art.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

It should be emphasized that many variations and modifications may be made to the above-described embodiments, the elements of which are to be understood as being among other acceptable examples. All such modifications and variations are intended to be included herein within the scope of this disclosure.

What is claimed is:

1. A packaged voltage-controlled temperature-compensated crystal oscillator (VCTCXO) comprising:
    a crystal oscillator configured to output a signal of a particular frequency;
    a temperature sensor configured to measure a temperature of the crystal oscillator;
    a microcontroller configured to generate an internal control voltage signal based at least in part on the temperature and an external control voltage received by the packaged VCTCXO; and
    a combiner configured to combine an internal control voltage and the external control voltage to generate a control voltage, wherein the control voltage is supplied to the crystal oscillator to cause the crystal oscillator to generate the signal of the particular frequency.

2. The packaged VCTCXO of claim 1, further comprising a digital to analog converter configured to generate the internal control voltage based at least in part on the internal control voltage signal.

3. The packaged VCTCXO of claim 1, wherein the combiner is further configured to weight the external control voltage and the internal control voltage differently.

4. The packaged VCTCXO of claim 1, wherein the combiner is further configured to weight the external control voltage more than the internal control voltage.

5. The packaged VCTCXO of claim 1, further comprising a non-volatile memory configured to store one or more coefficients based on a measured frequency error of the crystal oscillator for a set of test temperature and a set of test voltage values.

6. The packaged VCTCXO of claim 5, wherein the microcontroller is further configured to generate the internal control voltage signal based at least in part on the one or more coefficients.

7. The packaged VCTCXO of claim 5, wherein the measured frequency error is based on a deviation from a nominal frequency of the crystal oscillator.

8. The packaged VCTCXO of claim 5, wherein the microcontroller is further configured to generate piecewise polynomial curves based at least in part on the one or more coefficients, the piecewise polynomial curves used to generate the internal control voltage signal at the external control voltage and the temperature measured by the temperature sensor.

9. The packaged VCTCXO of claim 1, further comprising a voltage controlled temperature compensated crystal oscillator (VCTCXO) comprising the crystal oscillator and the temperature sensor.

10. The packaged VCTCXO of claim 1, wherein the microcontroller is configured to automatically generate the internal control voltage signal based at least in part on the temperature measured by the temperature sensor without input from a user.

11. A method for controlling a crystal oscillator, the method comprising:
   determining a characteristic of a crystal oscillator, wherein the characteristic of the crystal oscillator differs from a corresponding characteristic of another crystal oscillator;
   receiving a temperature signal corresponding to a temperature of the crystal oscillator;
   receiving an external voltage control signal;
   generating an internal voltage control signal based at least in part on the temperature signal and the characteristic of the crystal oscillator;
   determining a frequency adjustment signal based at least in part on a combination of the internal voltage control signal and the external voltage control signal; and
   providing the frequency adjustment signal to the crystal oscillator.

12. The method of claim 11, wherein the temperature signal comprises an analog voltage signal.

13. The method of claim 11, wherein the characteristic of the crystal oscillator is unique to the crystal oscillator and is not shared by other crystal oscillators.

14. The method of claim 11, wherein the external voltage control signal is received as an electronic frequency control signal from one of a feedback system or a phase-locked loop.

15. The method of claim 11, further comprising converting the temperature signal to a digital signal.

16. The method of claim 11, further comprising generating a profile for the crystal oscillator based on one or more characteristics of the crystal oscillator.

17. The method of claim 16, wherein generating the profile for the crystal oscillator may further comprise determining frequency versus temperature data and frequency versus voltage data across a range of temperatures for the crystal oscillator.

18. The method of claim 11, further comprising weighting the internal voltage control signal to obtain a weighted internal voltage control signal and weighting the external voltage control signal to obtain a weighted external voltage control signal, wherein the internal voltage control signal and the external voltage control signal are weighted differently.

19. The method of claim 18, wherein the combination of the internal voltage control signal and the external voltage control signal comprises a combination of the weighted internal voltage control signal and the weighted external voltage control signal.

20. The method of claim 11, wherein the temperature is an internal temperature of the crystal oscillator that differs from an ambient temperature of a device that includes the crystal oscillator.

21. The method of claim 11, wherein the frequency adjustment signal is further based at least in part on a nominal frequency of the crystal oscillator, wherein the frequency adjustment signal is selected to be within a threshold delta from the nominal frequency.

22. The method of claim 11, wherein the internal voltage control signal is generated based at least in part on the external voltage control signal.

* * * * *